United States Patent
Shiffer

(10) Patent No.: US 7,408,243 B2
(45) Date of Patent: Aug. 5, 2008

(54) HIGH TEMPERATURE PACKAGE FLIP-CHIP BONDING TO CERAMIC

(75) Inventor: Stephen R. Shiffer, Xenia, OH (US)

(73) Assignee: Honeywell International Inc., Morristown, NJ (US)

( * ) Notice: Subject to any disclaimer, the term of this patent is extended or adjusted under 35 U.S.C. 154(b) by 247 days.

(21) Appl. No.: 11/302,765

(22) Filed: Dec. 14, 2005

(65) Prior Publication Data

US 2007/0132076 A1    Jun. 14, 2007

(51) Int. Cl.
*H01L 23/495* (2006.01)
*H01L 23/48* (2006.01)

(52) U.S. Cl. .................. 257/666; 257/778; 257/690; 257/E23.039

(58) Field of Classification Search ................ 257/666, 257/778, E23.039, E25.032
See application file for complete search history.

(56) References Cited

U.S. PATENT DOCUMENTS

| | | | | |
|---|---|---|---|---|
| 5,563,442 A | 10/1996 | Mahulikar et al. | ........... | 257/666 |
| 5,744,383 A | 4/1998 | Fritz | ........... | 438/111 |
| 5,801,448 A * | 9/1998 | Ball | ........... | 257/778 |
| 5,847,929 A | 12/1998 | Bernier et al. | ........... | 361/719 |
| 6,006,427 A | 12/1999 | Zak | ........... | 29/840 |
| 6,022,583 A | 2/2000 | Falcone et al. | ........... | 427/96 |
| 6,069,023 A | 5/2000 | Bernier et al. | ........... | 438/107 |
| 6,080,264 A * | 6/2000 | Ball | ........... | 156/292 |
| 6,116,493 A | 9/2000 | Tanaka | ........... | 228/105 |
| 6,251,707 B1 | 6/2001 | Bernier et al. | ........... | 438/122 |
| 6,265,246 B1 * | 7/2001 | Ruby et al. | ........... | 438/113 |
| 6,274,650 B1 | 8/2001 | Cui | ........... | 523/457 |
| 6,378,759 B1 | 4/2002 | Ho et al. | ........... | 228/180.21 |
| 6,489,229 B1 | 12/2002 | Sheridan et al. | ........... | 438/614 |
| 6,492,197 B1 | 12/2002 | Rinne | ........... | 438/108 |
| 6,674,159 B1 * | 1/2004 | Peterson et al. | ........... | 257/680 |
| 6,707,135 B2 | 3/2004 | Madrid | ........... | 257/666 |
| 6,710,459 B2 | 3/2004 | Hsu | ........... | 257/778 |
| 6,800,946 B2 | 10/2004 | Chason et al. | ........... | 257/778 |
| 6,825,568 B2 | 11/2004 | Hung | ........... | 257/778 |
| 6,836,961 B2 | 1/2005 | Kang | ........... | 29/832 |
| 6,861,740 B2 | 3/2005 | Hsu | ........... | 257/691 |
| 6,891,247 B2 | 5/2005 | Kikuchi et al. | ........... | 257/532 |
| 6,930,399 B2 | 8/2005 | Paik et al. | ........... | 257/783 |
| 2002/0182773 A1 | 12/2002 | Su et al. | ........... | 438/111 |
| 2003/0227093 A1 | 12/2003 | Hsu | ........... | 257/778 |
| 2004/0067604 A1 * | 4/2004 | Ouellet et al. | ........... | 438/108 |
| 2004/0119171 A1 | 6/2004 | Chen et al. | ........... | 257/778 |

(Continued)

*Primary Examiner*—Nitin Parekh
(74) *Attorney, Agent, or Firm*—Kermit D. Lopez; Luis M. Ortiz; William B. Shelby

(57) ABSTRACT

A sensor package apparatus and method are disclosed in which a sensor die is provided and based on a substrate. An integrated circuit is generally associated with the sensor die. A leadframe is also provided, which is connected by at least one weld to the integrated circuit and the substrate. The integrated circuit, the leadframe, and the sensor die are configured in a flip-chip arrangement to protect the sensor die and form a sensor package apparatus that provides compact and robust electrical and physical connections thereof. The integrated circuit can be formed from, for example, silicon carbide. A metallization layer can also be formed on the integrated circuit, wherein the integrated circuit is configured upon the substrate of the sensor die. The metallization layer thus adheres to the integrated circuit via the weld(s).

14 Claims, 4 Drawing Sheets

U.S. PATENT DOCUMENTS

| | | | |
|---|---|---|---|
| 2004/0154164 A1 | 8/2004 | Kang | 29/841 |
| 2004/0188856 A1 | 9/2004 | Hsu | 257/778 |
| 2004/0256737 A1 | 12/2004 | Huang et al. | 257/778 |
| 2005/0040541 A1 | 2/2005 | Kurita et al. | 257/778 |
| 2005/0106784 A1 | 5/2005 | Xia | 438/125 |
| 2005/0110163 A1 | 5/2005 | Koo | 257/778 |
| 2006/0006523 A1* | 1/2006 | Coyle et al. | 257/704 |
| 2007/0096265 A1* | 5/2007 | Wallace | 257/666 |

* cited by examiner

HIGH TEMPERATURE PACKAGE FLIP-CHIP BONDING TO CERAMIC

TECHNICAL FIELD

Embodiments are generally related to sensing devices and methods thereof. Embodiments are also related to integrated circuit manufacturing and assembly processes, including the packaging of electrical components. Embodiments also relate to flip-chip packaging techniques and devices thereof.

BACKGROUND OF THE INVENTION

Most electronic packages, which include sensors connected to input/output devices thereof, utilize leadframes, a PCB, or combinations thereof. Such electronic packages generally require that conductors and/or insulators connect from a sensing element to the outside of the package for a customer to properly interface with the device. Leadframes provide customized configurations in which a designer can create many packages in order to meet a customer's overall need. Unfortunately, all of this customization must link in some electrical means to create a device. Common methods of connecting to leadframes including wire bonding and soldering techniques. Both of these connecting methods require that the leadframe be plated. Common plating material for wire bonding involves the use of gold, while tin is often utilized for soldering.

A number of complications are involved in the use of leadframes. For example, leadframes require cleaning following stamping and prior to plating in order to remove excessive oils and contaminates. Leadframes also function as a conductor and require an insulator to allow a usable electronic connection. Leadframes additionally require a significant capital investment to produce the conductor. The ability of a leadframe to be manipulated into a desired package configuration is very limited because the method of production chosen typically involves stamping. The simplest leadframe would be flat and straight. Any deviation from the simple design requires significant effort to ensure that angles and bends are precise for not only the package configuration, but also interface with the overmold process. It can thus be appreciated that the use of leadframes presents a number of assembly and manufacturing issues.

An alternative to leadframes is the PCB (Printed Circuit Board), which has become an economical means for producing circuitry utilizing copper foil, fiberglass, and resin to create the insulated conductor. This method maximizes the efficiency of the conductor when compared to the leadframe, because the conductor material requirement comes closer to meeting the electrical requirements required by the circuit. Yet, PCB issues include the cost of the board when the size becomes large. In addition, the conductor is merely flat.

Also, a requirement exists to provide an interconnect to the PCB in order to interface with the customer's I/O. Due to the standardization of PCBs, the designer must attempt to optimize the area within the panel. Additionally, routing may be required, not only to give the PCB dimensional size, but also to disconnect from the panel. Thus, the use of PCB components can result in a number of problems in component assembly and manufacturing, which may not in fact be superior to the use of leadframes.

In creating small electronic components, such as sensor devices, packing designs utilize metal conductors and/or leadframes to connect such devices to an input component, which is typically not cost-effective with respect to the overall assembly and manufacturing process. The solution to such cost issues touches many elements of the resulting component structure, such as material, labor and capital. A need thus exists for an assembly process, which overcomes these cost issues, while also providing the full capabilities of devices, such as PCB, leadframe and/or metal conductor components. It is believed that a solution to these problems lies in the combined use of Flip Chip On Board (FCOB), plastic substrate, and ultrasonic bonding techniques.

Sensors formed from integrated circuit technology often are formed from a die structure. The use of die technology has enabled integrated circuits and related components to be mass-produced for many consumer, industrial, commercial, defense and other applications. Some sensor technologies produced in this manner are configured upon a silicon die. One type of silicon die that is finding increasing use in integrated circuit applications is the SiC die. Some sensor devices are particularly suited, for example, to integrated circuit components configured from an SiC die. One example of such a sensor is the NOx sensor. Currently, there does not exist a cost effect means for bonding an SiC die, such as that utilized in, for example, an NOx sensor.

Platinum bonding has been offered as one solution to this problem. Platinum bonding configurations, however, tend to wear out the tools utilized the integrated circuit (IC) formation process and also rely upon fragile wire bonds that must be contended with during the IC packaging steps.

A number of chip designs are currently being implemented for high or extremely high heat applications. Standard techniques, such as solder and polymers are not capable of withstanding temperatures above 300° C. Brazing is another technique that is used in various chip designs. Brazing, however, is not commercially viable. Similarly, wire bonding is not a consistent means of die attachment due to wear, which result from the toughness of the wire utilized, even with enhancements in wire bonding tooling.

The tools utilized for such applications tend to degrade quickly resulting in bonding that is inconsistent in a short amount of time. Besides these electrical connection issues, the physical connection or mounting configuration of the IC chip also presents problems. Current applications utilize polymer, which again can only survive up to a temperature of approximately 300° C., which is not sufficient for high heat environments. In applications where the device is required to function in heats of, for example, 600° C. to 1000° C. and upwards, the number of materials and components that survive the heat and/or corrosive atmospheres is very limited.

It is believed that a cost-effective and efficient solution to this unsolved problem involves the use of "flip-chip" technology. In general flip chip interconnect technology is a method of joining a chip and a carrier together to form a package. The chip has an array of die pads each having a bump thereon. After the chip is flipped over, the bumps on the die pads are made to bond with contacts on the carrier so that the chip is electrically connected to the carrier via the bumps. The carrier also has internal circuits leading to external electronic devices. Since flip chip packaging technique is suitable for packaging high pin count chips and capable of reducing packaging area and shortening signal transmission paths, flip-chip technology has been applied quite widely to the manufacturing of chip packages. At present, chip packages that utilize flip-chip technique include flip-chip ball grid array (FCBGA), flip-chip pin grid array (FCPGA), chip-on-board (COB) and so on.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved sensor package.

It is another aspect of the present invention to provide for an improved sensor package apparatus and method for forming the same.

It is yet another aspect of the present invention to provide for a system a high temperature flip-chip package for sensor applications.

The aforementioned aspects and other objectives and advantages can now be achieved as described herein. A sensor package apparatus and method are disclosed in which a sensor die is provided and based on a substrate. An integrated circuit is generally associated with the sensor die. A leadframe is also provided, which is connected by at least one weld to the integrated circuit and the substrate. The integrated circuit, the leadframe, and the sensor die are configured in a flip-chip arrangement to protect the sensor die and form a sensor package apparatus that provides compact and robust electrical and physical connections thereof. The integrated circuit can be formed from, for example, silicon carbide. A metallization layer can also be formed on the integrated circuit, wherein the integrated circuit is configured upon the substrate of the sensor die. The metallization layer thus adheres to the integrated circuit via the weld(s). In some embodiments, the metallization may be formed from platinum. The weld(s) can be provided by laser welding. The leadframe can flex for thermal stress applications. Finally, the sensor package apparatus is capable of operating in an environment of approximately 600° C. to 1000° C. and above.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 2:
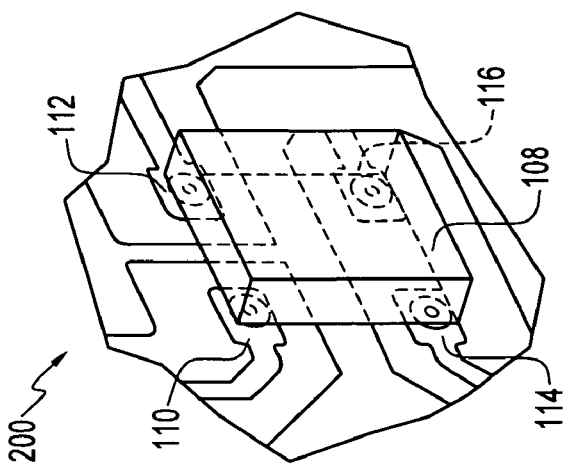
FIG. 2 illustrates a section of the packaging assembly depicted in FIG. 1 as assembled, in accordance with an embodiment.
Figure 1:
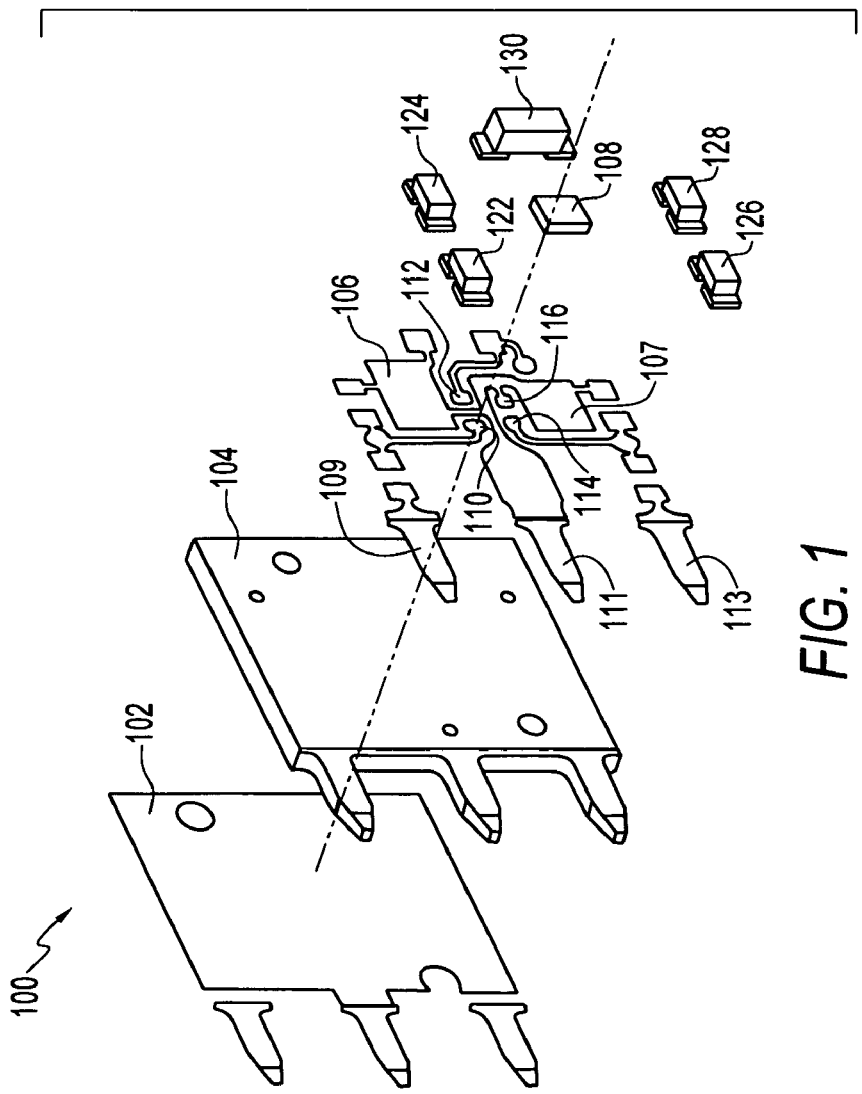
FIG. 1 illustrates an exploded view of a packaging assembly, which can be manufactured in accordance with one embodiment.

FIG. 1 illustrates an exploded view of a packaging system or packaging assembly 100, which can be manufactured in accordance with one embodiment. FIG. 2 illustrates a section 200 of the packaging assembly 100 depicted in FIG. 1 as assembled, in accordance with an embodiment. Note that in FIGS. 1 and 2, identical or similar parts or elements are indicated by identical reference numerals. A substrate 104 can initially be provided, which is located between a bottom portion 102 and top portions 106, 107, 109, 111, and 113. Note that substrate 104 can be formed from any number of substrate materials. For example, substrate 104 may be formed from plastic. Preferably, substrate 104 is formed from a material such as metallized ceramic. That is substrate 104 can be formed from ceramic surrounded by or integrated with a metal layer. Patterns can be formed on the ceramic substrate as traces that permit circuitry to be located for electrical connections thereof.

Substrate 104 can be subject to an ultrasonic bonding operation in which metal-to-metal connections (e.g., top portions 106, 107, 109, 111, and 113) are formed thereon. In this manner, substrate 104 can function as a complex substrate that provides structure and electrical connections, while allowing for associated, but inexpensive parts. Substrate 104 can function as a plastic insulator, depending upon design considerations and goals. Bottom portion 102 can be configured from any conductive metal, such as, for example, copper, nickel, platinum and so forth. In the configuration of FIG. 1, bottom portion 102 can also be designed to function as an EMC shield. Substrate 104 can form part of or a basis for a plastic leadframe.

The substrate 104 can function as part of packaging assembly 100 by connecting a die 108 to the substrate 104 to thereby configure the resulting conductive plastic trace assembly to function as a combined printed circuit board and package structure that includes electronic circuitry thereon. Die 108 can be attached to substrate 104 utilizing ultrasonic technology. Additional discrete components 122, 124, 126, 128, and 130 can also be connected to the substrate 104 to create the conductive plastic trace assembly (i.e., packaging assembly 100). Discrete components 122, 124, 126, 128 and 130 can be implemented as conductive components, depending upon design considerations. Such a packaging assembly 100 additionally can include a plurality of conductive contacts 110, 112, 114, and 116 to which die 108 attaches.

Such a packaging assembly 100 can create new manufacturing opportunities by increasing speed and reducing capital expenses due to the incorporation of tooling points into the plastic. The use of such tooling points promotes the consistent and accurate manipulation, placement, and structuring of packaging assemblies. As a result, few components are involved. In addition, handling and joint inspection is eliminated. Substrate 104 incorporates key elements for creating the packaging assembly 100 is important, including the structure, electronic circuitry and the metallization required for conduction and component interface.

Figure 3B:
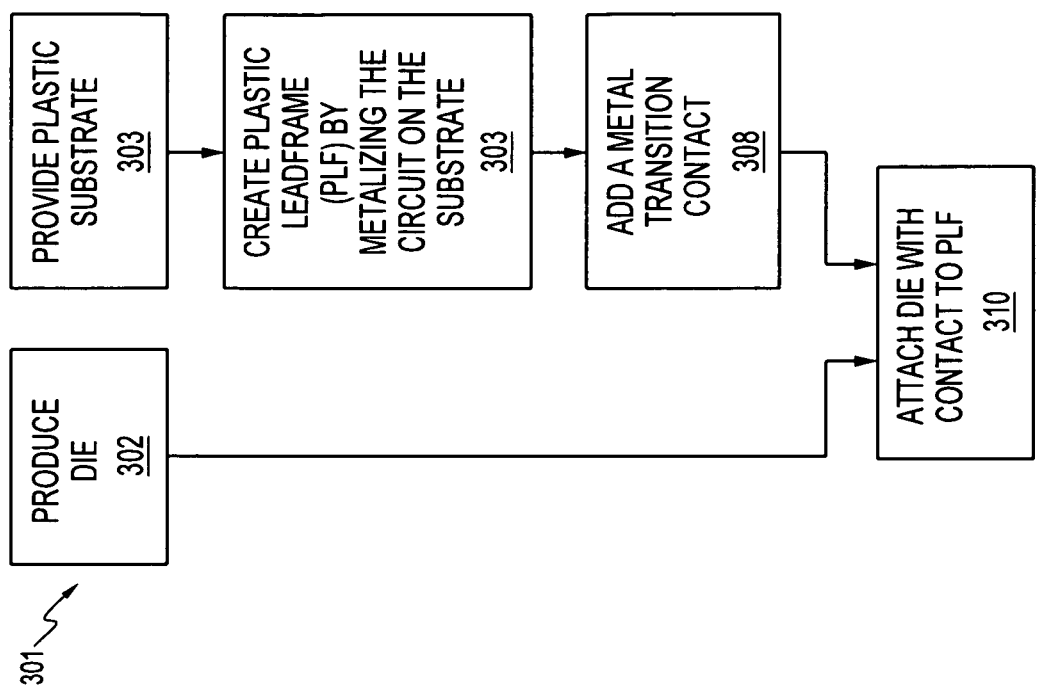
FIG. 3(b) illustrates a high level flow chart of manufacturing operations, which can be implemented in accordance with an alternative embodiment.
Figure 3A:
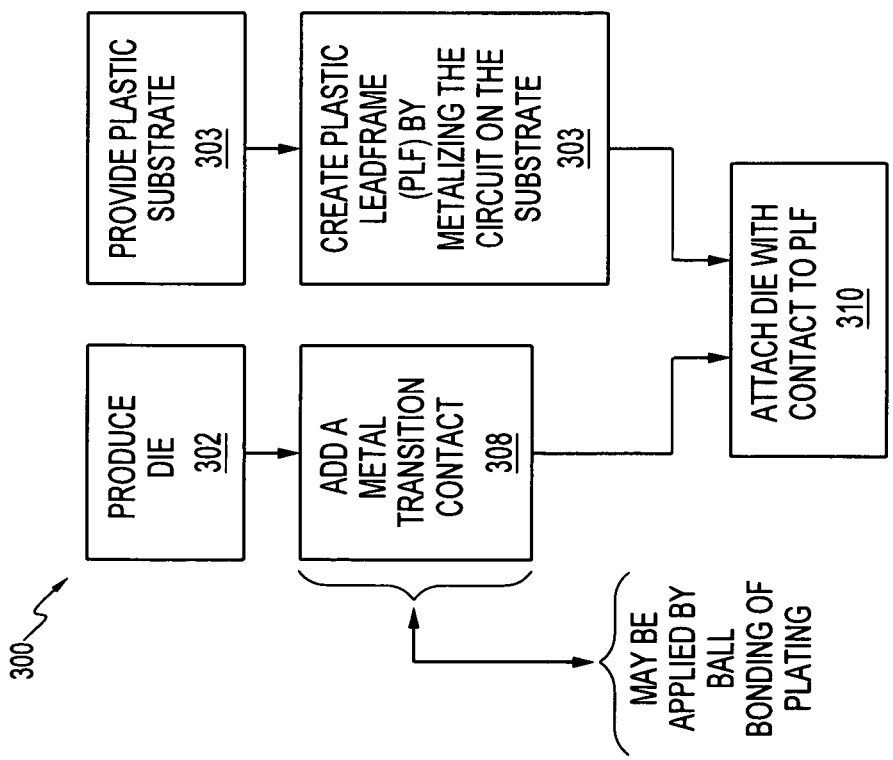
FIG. 3(a) illustrates a high level flow chart of manufacturing operations, which can be implemented in accordance with an embodiment.

FIG. 3(a) illustrates a high level flow chart 300 of manufacturing operations, which can be implemented in accordance with one embodiment. FIG. 3(b), on the other hand, illustrates a high level flow chart 301 of manufacturing operations, which can be implemented in accordance with an alternative embodiment. Note that in FIGS. 3(a) and 3(b), identical or similar parts or elements are generally indicated by identical reference numerals. The flow charts 300 and 301 are described and illustrated herein in order to depict alternative methodologies for flip chip metal bonding to a plastic leadframe.

As depicted at block 302 of FIG. 3(a), a die can be produced. Meanwhile, as illustrated at block 303, a plastic substrate can be provided, which then forms the plastic leadframe by building circuitry on the plastic as illustrated at block 304. The operation depicted at block 304 indicates that metallizing the circuit on the substrate can create the plastic leadframe. An example of such a plastic substrate is depicted in FIGS. 1-2 (i.e., see substrate 104). As depicted at block 308 of FIGS. 3(a) and 3(b), a metal transition contact can be configured to the die or the Plastic Leadframe (PLF) by a ball bond, plating, of other means to obtain electrical connection and provide a mass to conform to the second substrate for physical and electrical attachment as illustrated at block 308. Finally, as depicted at block 310, a die can be attached to the plastic leadframe through the transition contact.

Note that in FIG. 3(a), the operation depicted at block 308 generally occurs following the operation depicted at block 302, and/or simultaneously with the operations depicted at blocks 303 and/or 304. The operation depicted at block 310 of FIG. 3(a) can therefore occur following processing of the operation depicted at block 308 and the operation depicted at block 304. On the other hand, as illustrated in FIG. 3(b), the operation depicted at block 310 generally occurs following the operation depicted at 308 and the operation depicted at block 302.

Figure 4D:
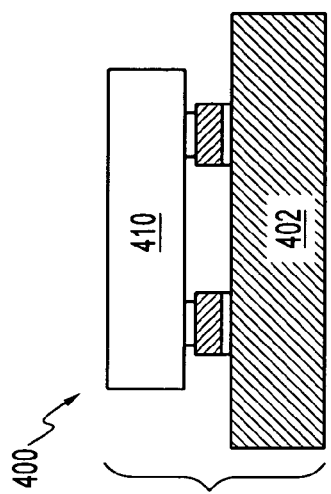
FIG. 4(d) illustrates a block diagram of a system, which can be configured in accordance with an alternative embodiment.
Figure 4B:
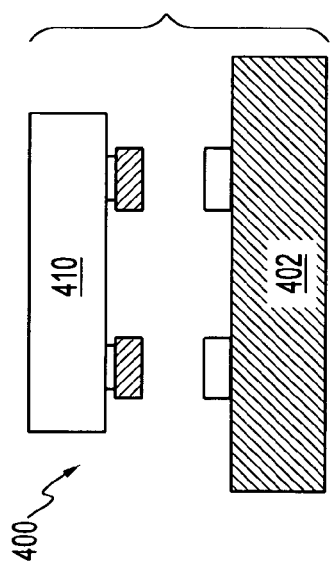
FIG. 4(b) illustrates a block diagram of a system, which can be configured in accordance with an alternative embodiment.
Figure 4C:
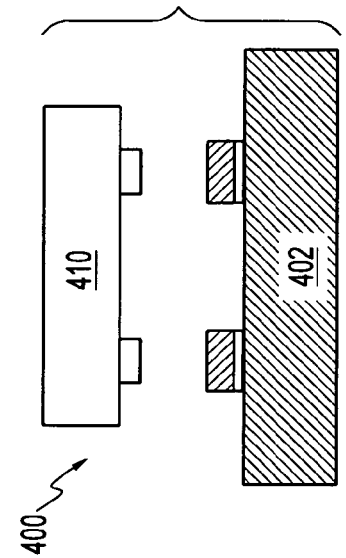
FIG. 4(c) illustrates a block diagram of a system, which can be configured in accordance with an alternative embodiment.
Figure 4A:
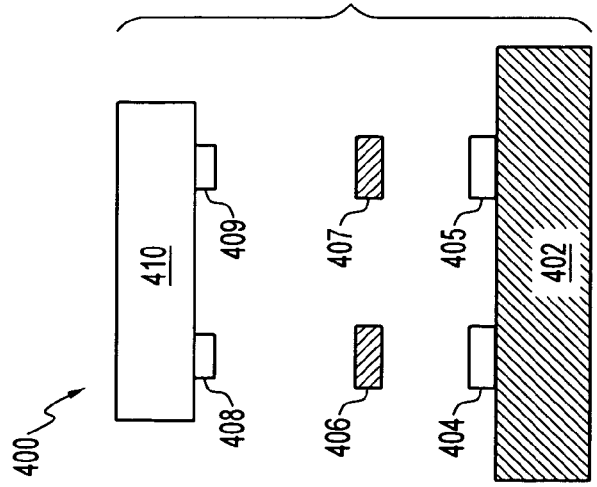
FIG. 4(a) illustrates a block diagram of a system, which can be configured in accordance with one embodiment.

FIGS. 4(a)-4(b) illustrate a block diagram of a system 400, which can be configured in accordance with preferred or alternative embodiments. Note that in FIGS. 4(a)-4(b), various configurations are illustrated, indicated how system 400 can be arranged. It can be appreciated that system 400 can be configured according to varying implementations. System 400 generally includes a plastic substrate 402, which is analogous to substrate 104 of FIG. 1. The circuitry on the plastic is depicted as elements 404 and 405. A metal transition contact 406 and/or 407 can function as the bonding interface between the die 410 and the Plastic Leadframe (PLF).

Such a bonding interface can provide the physical and electrical connection to complete the circuit. Die contact pads 408 and 409 are also depicted in FIGS. 4(a)-4(b), which functions, as pad(s) on die 410 where the transition contacts 406 and/or 407 respectively attach on the die 410. As indicated by the methodologies of flow charts 300 and 301 of FIG. 3, it can be appreciated that there are at least two chief means for constructing such a device. The variations illustrated in FIGS. 4(a) to 4(b) are based on which substrate the metal transition contact will be attached first, i.e., the die or the Plastic Leadframe.

Typically, the final attachment can be accomplished by ultrasonic welding, but it can be appreciated that welding is not the only attachment means, which can be implemented. Ultrasonic bonding, which is sometimes also referred to as wedge bonding, is preferred because it is generally inexpensive, and under the proper conditions results in a very satisfactory connection. Additionally, ultrasonic bonding does not rely on external heating of associated parts. Wedge bonding utilizes a wedge-shaped bonding tool to press the wire strongly against the pad. High frequency acoustic energy without external heat can then be applied to the bonding tool, which vibrates the wire against a pad to form a mechanical and electrical bond between the wire and the pad. In the embodiments disclosed here, the plastic substrate can be utilized as the pad itself.

Note that die 410 can be configured as a Flip Chip On Plastic Leadframe (FCOPLF) component. A number of advantages can be obtained from configuring die 410 as an FCOPLF component, particularly one that connects to plastic substrate 402 via metal bonding technology. For example, the use of die 410 as an FCOPLF component promotes a reduction in the inductance associated with signal paths thereof due to the presence of shorter interconnects. This is a key factor in high-speed applications such as high-speed sensors, assuming that die 410 comprises a high-speed sensor die. The use of FCOPLF technology also promotes a high packaging density, so that the entire surface of die 410 can be utilized for interconnections and circuit routing rather than merely the edges thereof. Overall the resulting package size can be reduced through the use of FCOPLF technology.

Figure 5:
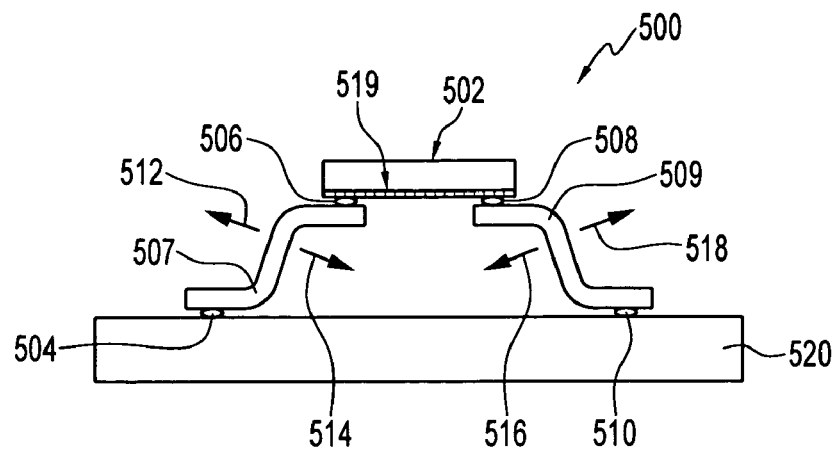
FIG. 5 illustrates a sensor package apparatus, which can be implemented in accordance with a preferred embodiment.

FIG. 5 illustrates a sensor package apparatus 500, which can be implemented in accordance with a preferred embodiment. Note that in FIGS. 5-7, identical or similar parts are generally indicated by identical reference numerals. The sensor package apparatus 500 can be provided as sensor die, which is based on a substrate 520. An integrated circuit 502 is generally associated with the sensor die or substrate 520. A leadframe 507, 509 can be provided, which is connected by one or more welds 504, 506, 508, 510 to the integrated circuit and the substrate. The integrated circuit 502 the leadframe 507, 509, and the sensor die or substrate 520 can be configured in a flip-chip arrangement to protect the sensor die or substrate 520 and form the sensor package apparatus 500, which provides compact and robust electrical and physical connections thereof.

The substrate 520 can be formed from, for example, silicon carbide. A metallization layer 519 can also be formed on the integrated circuit 502. The metallization layer 519 can thus adhere to the integrated circuit 502 via the welds 504, 506, 508, 510. In some embodiments, the metallization layer 519 may be formed from platinum. The weld(s) 504, 506, 508, 510 can be provided by laser welding. The leadframe 507, 509 can flex for thermal stress applications as indicated by arrows 512, 514, 516, 518. Finally, the sensor package apparatus 500 is capable of operating in an environment of approximately 600° C. to 1000° C. and above.

Figure 6:
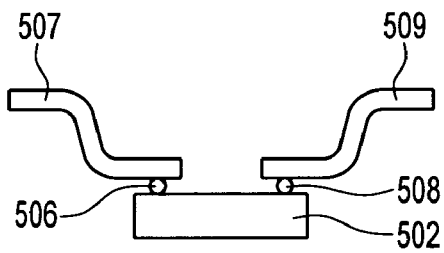
FIG. 6 illustrates the first step of a manufacturing process for forming the sensor package apparatus depicted in FIG. 5, in accordance with a preferred embodiment.
Figure 7:
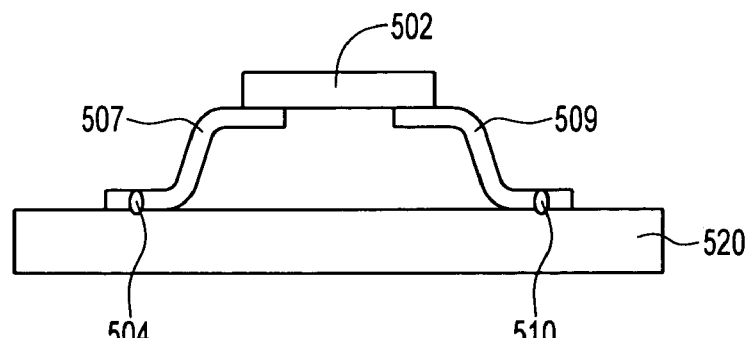
FIG. 7 illustrates the second step of a manufacturing process for forming the sensor package apparatus depicted in FIG. 5, in accordance with a preferred embodiment.

FIG. 6 illustrates the first step of a manufacturing process for forming the sensor package apparatus 500 depicted in FIG. 5, in accordance with a preferred embodiment. FIG. 7 illustrates the second step of a manufacturing process for forming the sensor package apparatus 500 depicted in FIG. 5, in accordance with a preferred embodiment. In the first step depicted in FIG. 6, the leadframe 507, 509 can be welded to the integrated circuit 502 via the welds 506, 508. In the second step depicted in FIG. 7, the leadframe 507, 509 and the leadframe integrated circuit assembly formed thereof can be welded to the substrate 520 via welds 504, 510.

Depending upon the particular application and desired embodiment, the integrated circuit 502 can be, for example, SiC (Silicon Carbide) or another material that can survive a high temperature. The metallization layer 519 on the integrated circuit 502 can be, for example, platinum, but is not required. The metallization layer 519 needs to adhere to the integrated circuit 502 and also conduct electricity and survive high temperature environments. The substrate 520 can be, for example, a PCB formed from metallized ceramic. The patterns on such a ceramic can be provided as traces permitting the circuitry for connection. Ceramic boards are ideal for use in high temperature applications such as automotive or aerospace due to the temperature and thermal shock.

The key to the design depicted in FIGS. 5-7 is the leadframe and connection technique in which the leadframe 507, 509 is welded to the integrated circuit 502 and the substrate 520. The use of laser welding permits a strong weld for structure and electrical connections, along with the ability to connect dissimilar materials to provide small, but precise welds. Laser welding also provides for speed attachments of components to the resulting sensor package apparatus 500.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A sensor package apparatus, comprising:
   a sensor die comprising a substrate, the die having a top surface and a bottom surface, the bottom surface having an exposed portion including;
   an integrated circuit associated with said sensor die;
   a leadframe, wherein said leadframe is directly connected by at least one weld to said sensor die at the bottom surface, wherein said leadframe flexes for thermal stress applications and wherein said integrated circuit, said leadframe, and said sensor die are configured in a flip-chip arrangement to protect said sensor die and form a sensor package apparatus that provides compact and robust electrical and physical connections thereof.

2. The apparatus of claim 1 wherein said integrated circuit comprises silicon carbide.

3. The apparatus of claim 1 further comprising a metallization layer formed on said integrated circuit, wherein said integrated circuit is configured upon said substrate of said sensor die.

4. The apparatus of claim 3 wherein said metallization layer adheres to said integrated circuit via said at least one weld.

5. The apparatus of claim 3 wherein said metallization layer comprises platinum.

6. The apparatus of 1 wherein said substrate comprises a metallized ceramic.

7. The apparatus of claim 1 wherein said sensor package apparatus is capable of operating in an environment of approximately 600° C. to 1000° C. and above.

8. The apparatus of claim 1 wherein a mounting substrate comprises a Printed Circuit Board (PCB).

9. A sensor package apparatus, comprising:
   a sensor die comprising a substrate, the die having a top surface and a bottom surface, the bottom surface having an exposed portion including;
   an integrated circuit associated with said sensor die, wherein said integrated circuit comprises silicon carbide;
   a leadframe, wherein said leadframe is directly connected by at least one weld to said sensor die at the bottom surface and wherein said leadframe flexes for thermal stress applications; p1 a metallization layer formed on said integrated circuit, wherein said integrated circuit, said leadframe, and said sensor die are configured in a flip-chip arrangement to protect said sensor die and form a sensor package apparatus that provides compact and robust electrical and physical connections thereof.

10. The apparatus of claim 9 wherein said metallization layer comprises platinum.

11. The apparatus of claim 9 wherein said sensor package apparatus is capable of operating in an environment of approximately 600° C. to 1000° C. and above.

12. The apparatus of claim 10 wherein said metallization layer adheres to said integrated circuit via said at least one weld.

13. The apparatus of claim 10 wherein said metallization layer comprises platinum.

14. The apparatus of claim 9, wherein a mounting substrate comprises a printed circuit board (PCB).

* * * * *

UNITED STATES PATENT AND TRADEMARK OFFICE
CERTIFICATE OF CORRECTION

| | | |
|---|---|---|
| PATENT NO. | : 7,408,243 B2 | Page 1 of 1 |
| APPLICATION NO. | : 11/302765 | |
| DATED | : August 5, 2008 | |
| INVENTOR(S) | : Stephen R. Shiffer | |

It is certified that error appears in the above-identified patent and that said Letters Patent is hereby corrected as shown below:

In Column 8, line 23, delete p1.

Signed and Sealed this

Twenty-third Day of September, 2008

JON W. DUDAS
*Director of the United States Patent and Trademark Office*